(12) United States Patent
Park

(10) Patent No.: US 7,102,942 B2
(45) Date of Patent: Sep. 5, 2006

(54) ENCODING CIRCUIT FOR SEMICONDUCTOR DEVICE AND REDUNDANCY CONTROL CIRCUIT USING THE SAME

(75) Inventor: Young Soo Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 170 days.

(21) Appl. No.: 10/876,121

(22) Filed: Jun. 24, 2004

(65) Prior Publication Data

US 2005/0099858 A1 May 12, 2005

(30) Foreign Application Priority Data

Nov. 11, 2003 (KR) ...................... 10-2003-0079476

(51) Int. Cl.
*G11C 7/00* (2006.01)
(52) U.S. Cl. .................. 365/200; 365/189.05; 365/203
(58) Field of Classification Search ............... 365/200, 365/189.05, 203
See application file for complete search history.

(56) References Cited

U.S. PATENT DOCUMENTS

| 5,920,515 | A | * | 7/1999 | Shaik et al. | ................. | 365/200 |
| 6,094,381 | A | * | 7/2000 | Isa | ............................. | 365/200 |
| 6,292,408 | B1 | * | 9/2001 | Kawashima et al. | ... | 365/189.11 |
| 6,441,676 | B1 | * | 8/2002 | Koehl et al. | ................. | 327/525 |
| 6,972,599 | B1 | * | 12/2005 | Forbes | ........................ | 326/97 |

* cited by examiner

*Primary Examiner*—Anh Phung
*Assistant Examiner*—N Nguyen
(74) *Attorney, Agent, or Firm*—Marshall, Gerstein & Borun LLP

(57) ABSTRACT

An encoding circuit for a semiconductor apparatus and a redundancy control circuit using the same, in which a multiplicity of external signals are coupled to a precharge node in common to output a predetermined encoding signal. According to the encoding circuit, it is possible to reduce an area occupied by the encoding circuit and advantageously to prevent a time delay effect from the supply of the external signals to the generation of the encoding signal. Further, it is possible to lessen the generation of glitch signals due to delays in generating global redundancy signals of a redundancy circuit, so that the performance of the semiconductor apparatus can be improved.

12 Claims, 3 Drawing Sheets

US 7,102,942 B2

ENCODING CIRCUIT FOR SEMICONDUCTOR DEVICE AND REDUNDANCY CONTROL CIRCUIT USING THE SAME

This application relies for priority upon Korean Patent Application No. 2003-0079476 filed on Nov. 11, 2003, the contents of which are herein incorporated by reference in their entirety.

BACKGROUND

1. Field of the Invention

The present invention relates to an encoding circuit and a redundancy control circuit using the same, and specifically, to an encoding circuit for generating a global signal from encoding a local repair signal provided by a redundancy block.

2. Discussion of Related Art

In general, a semiconductor device includes a multiplicity of redundancy blocks in order to improve a yield thereof. A specific redundancy block becomes active in accordance with an address and input/output (I/O) signal to be repaired. During this, it needs a global repair signal to represent an activation of a repair mode in a chip operation. Such a global repair signal is generated by encoding local repair signals, supplied by each repair block.

FIG. 1 illustrates an encoding circuit within a conventional redundancy circuit.

Referring to FIG. 1, the encoding circuit includes first through sixteenth NOR gates NO1 to NO16 for outputting first through sixteenth logic signals respectively in response to two local repair signals among first through thirty-second local repair signals REP<0:31>, first through eighth NAND gates NA1 to NA8 receiving the first through sixteenth logic signals outputted from the NOR gates NO1 to NO16, wherein each NAND gate receives two logic signals among the first through sixteenth logic signals, seventeenth through twentieth NOR gates NO17 to NO20 receiving output signals of the first to eighth NAND gates NA1 to NA8, wherein each NOR gate receives two logic signals among the output signals of the NAND gates NA1 to NA8, ninth and tenth NAND gates NA9 and NA10 receiving output signals of the NOR gates NO17 to NO20, wherein each NAND gate receives two logic signals among the output signals of the NOR gates NO17 to NO20, and a twenty-first NOR gate NO21 and an inverter I1 that generates a global repair signal REDGEN by receiving an output signals of the NAND gates NA9 and NA10.

In the encoding circuit shown in FIG. 1, when one of the first through thirty-second local repair signals REP<0:31> is logically high at least, the global repair signal is set to high to inform that a redundancy operation is being carried out in a chip.

However, as a size of the encoding circuit block conventionally used is very large, the encoding circuit block occupies a large portion in a chip. Especially, when the number of local repair signals is increased as the number of redundancy blocks is increased, an area for the encoding circuit may be non-linearly and sharply expanded. Moreover, since it is required that the local repair signals have to be passed to logic gates for five time of logic combination in order to generate the global repair signal, a time delay about 3 ns is consumed until the generation of the global repair signal from the supply of the local repair signals in the conventional encoding circuit, which is disadvantageous to enhancing the processing speed of the redundancy operation. As a result, there is a problem of inducing glitch signals in generating I/O signals.

SUMMARY OF THE INVENTION

The present invention is directed to an encoding circuit of a semiconductor apparatus and a redundancy control circuit using the same, solve the aforementioned problems, capable of reducing an area occupied by a redundancy circuit by employing an encoder with a common encoding scheme and eliminating unnecessary glitch signals and time delays by contemporizing the generation of global signals and I/O signals.

One aspect the present invention is to provide an encoding circuit of a semiconductor apparatus, including: a precharge node; a first PMOS transistor for supplying a power supply voltage to the precharge node; a multiplicity of NMOS transistors connected between the precharge node and a ground voltage in parallel, being driven by a multiplicity of external signals; and an output circuit for generating an encoding signal in accordance with a logical state of the precharge node.

Another aspect of the present invention is to provide an encoding circuit of a semiconductor apparatus, comprising: a precharge node; a 100'th NMOS transistor for supplying a ground voltage to the precharge node; a multiplicity of PMOS transistors connected between the precharge node and a power supply voltage in parallel, being driven by a multiplicity of external signals; and an output circuit for generating an encoding signal in accordance with a logical state of the precharge node.

The present invention also provides a redundancy control circuit of a semiconductor apparatus, including: a multiplicity of repair address selector for generating local redundancy signals in accordance with an address signal and a redundancy enable signal; a multiplicity of repair I/O selectors for outputting I/O information signals to be repaired in accordance with the local redundancy signals, corresponding each to the repair address sectors; an I/O decoder for generating I/O signals from the I/O information signals; and an encoder for generating reset signals to initiate the I/O information signals and for generating a global redundancy signal to inform an activation of a redundancy operation in a chip and to control the I/O decoder, in accordance with the local redundancy signals.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
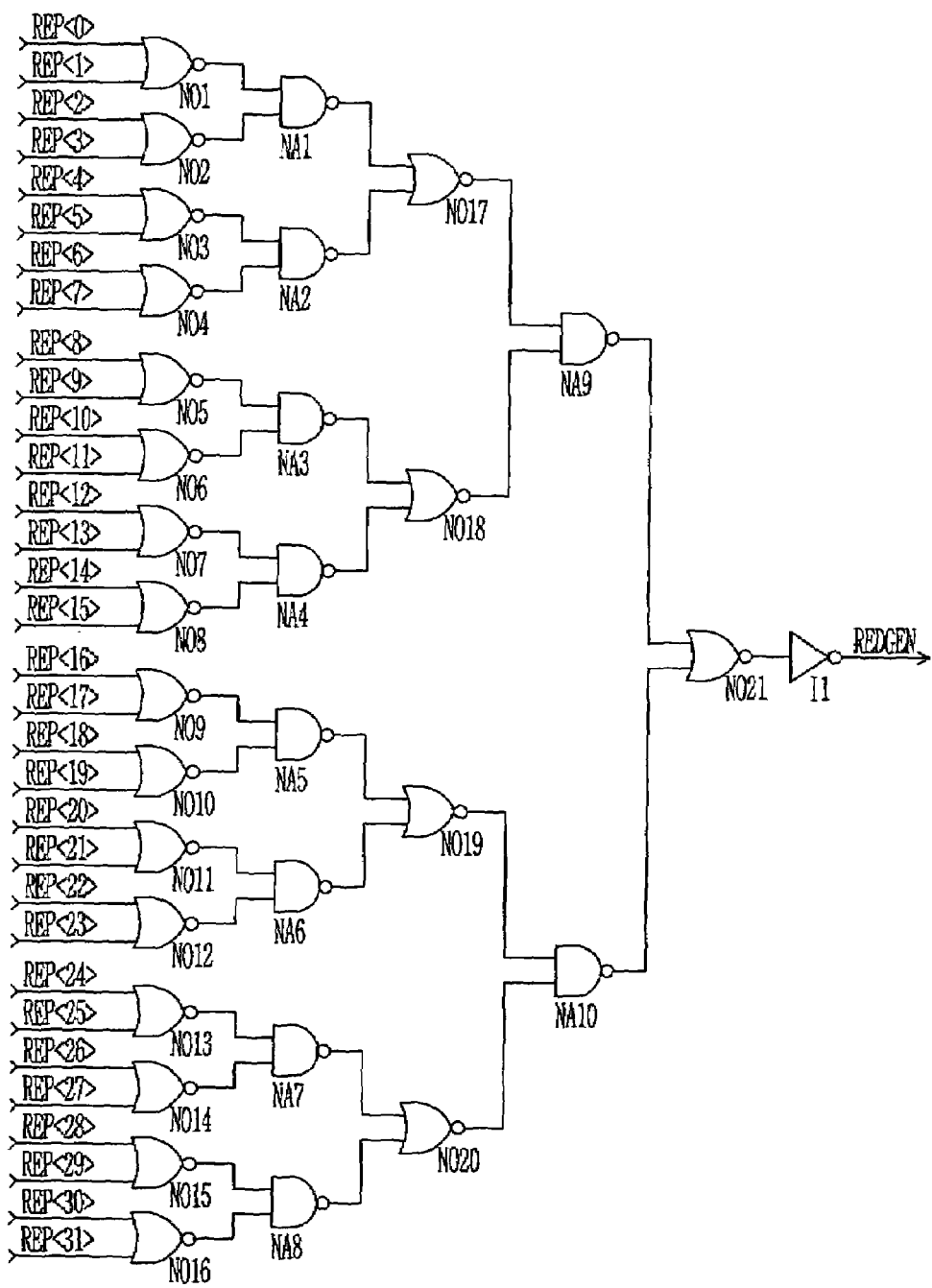
FIG. 1 illustrates an encoding circuit within a conventional redundancy circuit.
Figure 2:
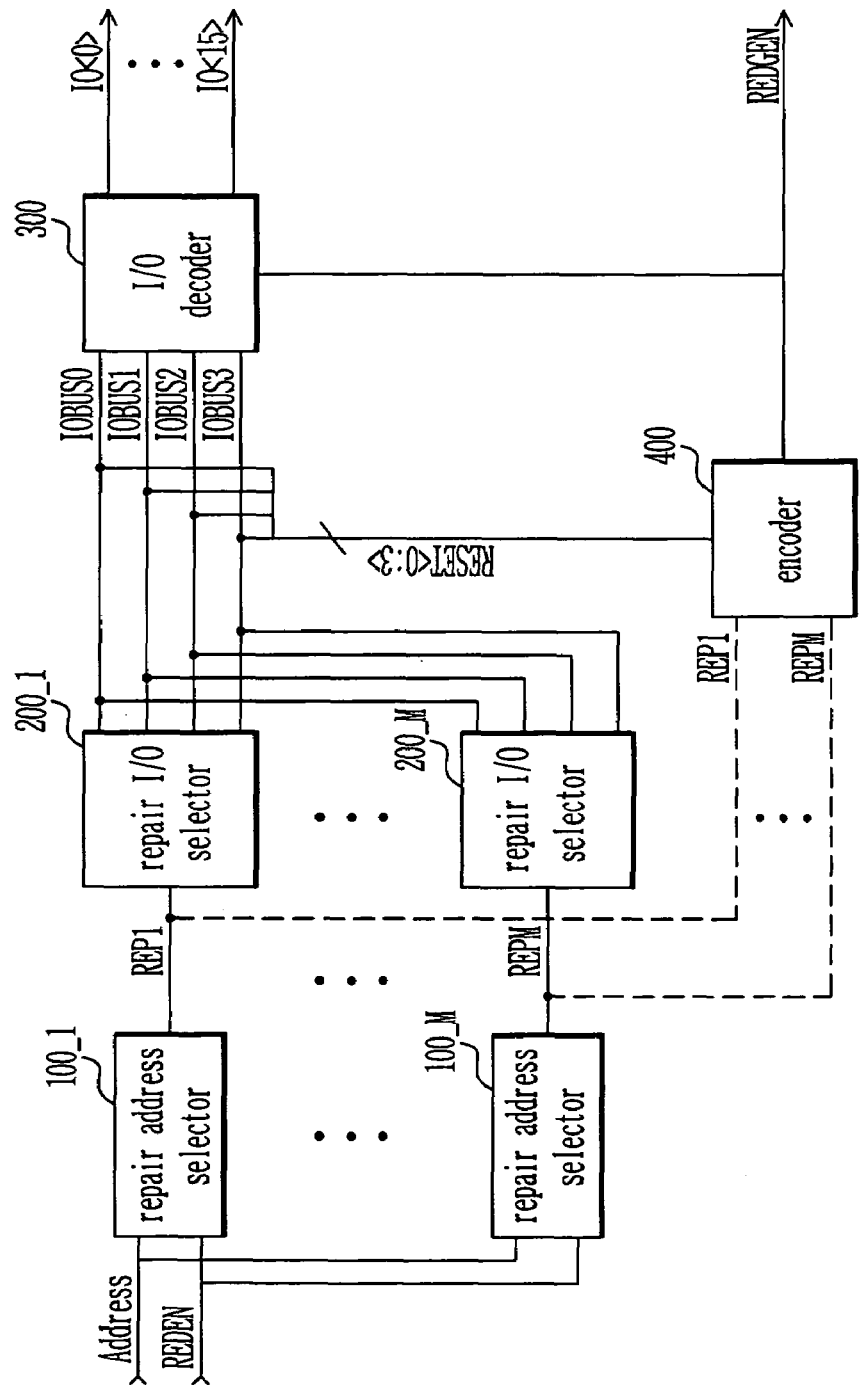
FIG. 2 is a block diagram of a redundancy control circuit according to the present invention.

FIG. 2 is a block diagram of a redundancy control circuit according to the present invention.

Referring to FIG. 2, the redundancy control circuit includes: a plurality of repair address selectors 100_1 to 100_M for generating local redundancy signals REP<1:M> in accordance with an address signal Address and a redundancy enable signal REDEN; a plurality of repair I/O selectors 200_1 to 200_M for outputting I/O information signals IOBUS<0:3> for the repair in accordance with the local redundancy signals REP<1:M> of the repair address selectors 100_1 to 100_M, each corresponding to each of the repair address selectors 100_1 to 100_M; an I/O decoder 300 for generating I/O signals IO<0:15> by decoding the I/O information signals IOBUS<0:3> to be repaired; and an encoder 400 for generating reset signals RESET<0:3> to initiate the I/O information signals IOBUS<0:3>, and generating a global redundancy signal REDGEN to inform an activation of a redundancy operation in a chip and to control the I/O decoder 300, in accordance with the local redundancy signals REP<1:M>.

Now will be described about an operation of the redundancy control circuit constituted as aforementioned.

When the redundancy enable signal REDEN is logically high and a specific address Address is input thereto, a local redundancy signal (e.g., one of REP<1:M>) corresponding to the specific address is generated with a logical high level from its corresponding repair address selector among the repair address selectors 100_1 to 100_M. Other repair address selectors disaccording to the specific address generate logical-low local redundancy signals of logically low (e.g., the rest of REP<1:M>). The local redundancy signals REP<1:M>, as outputs of the repair address selectors 100_1 to 100_M repectively, are used each to operate a plurality of redundancy blocks.

As the repair I/O selectors 200_1 to 200_M are connected to the repair address selectors 100_1 to 100_M, corresponding to each other, a repair I/O selector (one of 200_1 to 200_M) corresponding to the logical-high local redundancy signal (one of REP<1:M>) of logically low only outputs an I/O information stored therein. In other words, the repair I/O selectors 200_1 to 200_M have their own I/O information for the repair and output the I/O information, which needs to be repaired, through the I/O buses (i.e., IOBUS<0:3>) in accordance with the local redundancy signals REP<1:M> transferred thereto. For instance, if there is a need to repair I/O=3, the I/O information signal is set to 0011 (I/O bus<3:0>=0011).

The I/O decoder 300 is driven by the global redundancy signal REDGEN, decodes the I/O information signals IOBUS<0:3> and outputs the decoded I/O information signals by way of IO<15:0> as the I/O signals IO<0:15> to be repaired.

By the way, the encoder 400 outputs the global redundancy signal REDGEN of logically low to inform there is no redundancy operation and controls the I/O decoder 300 not to be active, when any one of the local redundancy signals REP<1:M> does not set to logically high to condition a non-operation state. The encoder 400 outputs the reset signals RESET<0:3> to initiate the I/O information signals IOBUS<0:3>, outputs of the repair I/O selectors 200_1 to 200_M, all to logically low. In other words, the reset signals RESET<0:3> of logically low are applied to the IO buses to initiate the I/O information signals IOBUS<3:0> all to logically low levels.

On the other hand, if a redundancy operation is enabled according when at least one of the local redundancy signals REP<1:M> goes to a logic high level, the global redundancy signal REDGEN is outputted in a logic high level to inform that the redundancy operation is being active at present, and controls the I/O decoder 300 to be operable. And, the reset signals RESET<0:3> are floated (i.e., inactive) to permit the I/O information signals IOBUS<0:3>, the outputs of the repair I/O selectors 200_1 to 200_M, to be transferred into the I/O decoder 300.

Figure 3:
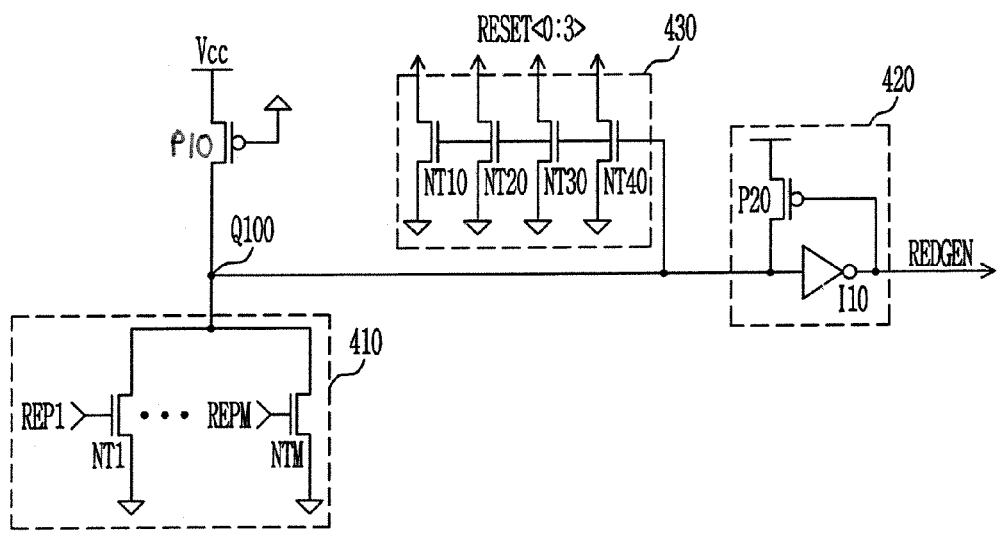
FIG. 3 is a circuit diagram of an encoder according to an embodiment of the present invention.

FIG. 3 is a circuit diagram of an encoder 400 according to the preferred embodiment of the present invention.

Referring to FIG. 3, the encoder 400 includes a precharge node Q100, a first PMOS transistor P10 for supplying a power supply voltage to the precharge node Q100, a plurality of NMOS transistors 410 connected between the precharge node Q100 and a ground voltage in parallel and being driven by a plurality of external signals, and an output circuit 420 for outputting an encoding signal REDGEN (i.e., the global redundancy signal) in accordance with a logical state of the precharge node Q100.

Now, it will be described in more detail about the structure and operation of the encoder relative to the redundancy control circuit as cited above.

The encoder 400 also includes a reset circuit 430 for generating the reset signals RESET<0:3> to initiate the I/O buses IOBUS<0:3> in accordance with a voltage state of the precharge node Q100. The reset circuit 430 is constructed of a plurality of NMOS transistors that are connected between the I/O buses IOBUS<0:3> (output terminals of the reset signals) and the ground voltage Vss and driven by a voltage state of the precharge node Q100.

The local redundancy signals REP<1:M> (REP1 to REPM) are used as the external signals to the encoder 400. The plural NMOS transistors 410 are connected between the precharge node Q100 and the ground voltage Vss in parallel, in which first through $M^{th}$ NMOS transistors NT1 to NTM (i.e., the plural NMOS transistors 410) are constructed to be driven each by the local redundancy signals REP<1:M>.

The output circuit 420 generates the global redundancy signal REDGEN as its encoding signal depending on a logic state of the precharge node Q100. The output circuit includes an inverter I10 converting a logic state of the precharge node Q100 into the global redundancy signal REDGEN, and a second PMOS transistor P20 supplying the power supply voltage Vcc to the precharge node Q100 in accordance with the global redundancy signal REDGEN.

An exemplary operation of the encoder constructed as aforementioned will be explained in conjunction with the operation the redundancy control circuit.

When there is no occurrence of a redundancy operation according to the address Address, the local redundancy signals REP<1:M> applied to the encoder 400 are all set to logical low. Therefore, the NMOS transistors NT1 to NTM controlled by the local redundancy signals REP<1:M> is not turned on. During this, a logical-high signal is applied to the precharge node Q100 by way of the first PMOS transistor P10.

The logical-high signal at the precharge node Q100 turns on the NMOS transistors NT10 to NT40 of the reset circuit 430 on to output the reset signals RESET<0:3> of logical low. The reset signals RESET<0:3> reset all the I/O buses, to which the I/O information signals IOBUS<0:3> become logically low. And, the logical-high signal of the precharge node, which is the power supply voltage level, is output as the global redundancy signal REDGEN of logical low through an inverter of the output circuit 420. According to the global redundancy signal REDGEN of logical low, the second PMOS transistor P20 is turned on to continuously supply the logical-high power supply voltage to the precharge node Q100.

Otherwise, when a redundancy operation is enabled in accordance with the address Address applied thereto, at least one of the local redundancy signals REP<1:M> (i.e., REP1 to REPM) becomes a logical-high signal. Therefore, at least one of the NMOS transistors NT1 to NTM is turned on. And, the power supply voltage Vcc is supplied to the precharge node Q100 by way of the first PMOS transistor P10.

Here, if the NMOS transistors NT1 to NTM are designed to have their current drivability larger than those of the tenth PMOS transistor P10, the power supply voltage Vcc charging the precharge node Q100 through the first PMOS transistor P10 is connected to the ground voltage Vss by way of at least one of the NMOS transistors NT1 to NTM and thereby the precharge node Q100 is discharged to the ground voltage that is logically low.

The logical-low signal of the precharge node Q100 does not turn on the NMOS transistors NT10 to NT40 to thereby make the reset signals RESET<0:3> to be floated. The logical-low signal of the precharge node Q100, i.e., the ground voltage level, is output as the global redundancy signal REDGEN of logical high by way of the inverter of the output circuit 420. According to the global redundancy signal REDGEN of logical high, the second PMOS transistor P20 is turned off to keep the precharge node Q100 on the ground voltage Vss as logical low.

By a simulation result, provided that the first PMOS transistor P10 was designed with 3 μm in channel width and with 1,5 μm in channel length while the NMOS transistors NT1 to NTM with 3 μm in channel width and with 0.35 μm in channel length, a current less than 50 μA was flown and the global redundancy signal is generated in a switching time less than 1 ns.

Figure 4:
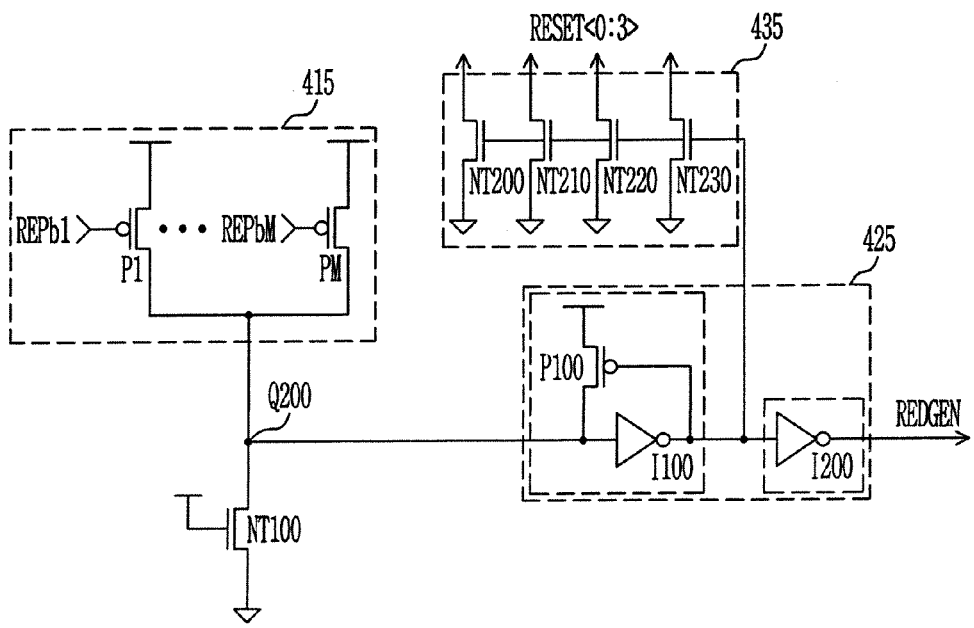
FIG. 4 is a circuit diagram of an encoder according to another embodiment of the present invention.

FIG. 4 is a circuit diagram of an encoder 400 according to another embodiment of the present invention.

Referring to FIG. 4, the encoder 400 according to another embodiment of the present invention includes a precharge node Q200, a first NMOS transistor NT100 for supplying a ground voltage to the precharge node Q200, a plurality of PMOS transistors 415 connected between the precharge node Q200 and a power supply voltage in parallel and being driven by a plurality of external signals, and an output circuit 425 for outputting an encoding signal REDGEN (i.e., the global redundancy signal) in accordance with a logical state of the precharge node Q200.

Now, it will be described in more detail about the structure and operation of the encoder relative to the redundancy control circuit as cited above.

The encoder shown in FIG. 4 also includes a reset circuit 435 for generating the reset signals RESET<0:3> to initiate the I/O buses IOBUS<0:3> in accordance with a predetermined control signal of the output circuit 425. The reset circuit 435 is constructed of a plurality of resetting NMOS transistors NT200 to NT230 that are connected between the I/O buses IOBUS<0:3> (output terminals of the reset signals) and the ground voltage Vss and driven by the predetermined control signal of the output circuit 425.

Reversed local redundancy signals REPb<1:M> (REPb1 to REPbM) are used as the external signals to the encoder 400. The plural PMOS transistors 415 are connected between the precharge node Q200 and the power supply voltage Vcc in parallel, in which first through Mth PMOS transistors P1 to PM (i.e., the plural PMOS transistors 415) are constructed to be driven each by the reversed local redundancy signals REPb<1:M>.

The output circuit 425 generates the global redundancy signal REDGEN as its encoding signal depending on a logical state of the precharge node Q200. The output circuit 425 includes a first inverter I100 converting a logic state of the precharge node Q200 into the predetermined control signal, a PMOS transistor P100 supplying the power supply voltage Vcc to the precharge node Q200 in accordance with the predetermined control signal (i.e., an output of the first inverter I100), and a second inverter I200 converting a reversed logic state of the precharge node Q200 into the global redundancy signal REDGEN.

An exemplary operation of the encoder constructed as aforementioned will be explained in conjunction with the operation the redundancy control circuit.

When there is no occurrence of a redundancy operation according to the address Address, the reversed local redundancy signals REPb<1:M> applied to the encoder 400 are all set to logical high. Therefore, the PMOS transistors P1 to PM controlled by the reversed local redundancy signals REPb<1:M> do not conductive. During this, a logical-low signal is applied to the precharge node Q200 by way of the first NMOS transistor NT100.

The logical-low signal at the precharge node Q200 is generated as a logical-high control signal through the first inverter I100. The logical-high control signal is output as the global redundancy signal REDGEN of logical low by way of the second inverter I200. During this, the logical-high control signal turns the resetting NMOS transistors NT200 to NT230 of the reset circuit 435 on to output the reset signals RESET<0:3> of logical low. As a result, the reset signals RESET<0:3> reset all the I/O buses, to which the I/O information signals IOBUS<0:3> becomes logical low.

Otherwise, when a redundancy operation is enabled in accordance with the address Address applied thereto, at least one of the reversed local redundancy signals REPb<1:M> (i.e., REP1 to REPM) becomes a logical-low signal. Therefore, at least one of the PMOS transistors P1 to PM is turned on.

Here, it is desirable to differentiate resistance values between the PMOS transistors P1 to PM and the NMOS transistor NT100 so as to apply a logical-high signal to the precharge node Q200 by the condition of voltage division effect thereof.

The logical-high signal of the precharge node Q200 is converted into a predetermined control signal of logical low by the first inverter I100. The logical-low control signal is outputted as the global redundancy signal REDGEN of logical high by way of the second inverter I200. During this, the logical-low control signal turns on the PMOS transistor P100 to supply the power supply voltage Vcc to the precharge node Q200, and turns the resetting NMOS transistors NT200 to NT230 off to make the reset signals RESET<0:3> be floated.

As aforementioned, the present invention can reduce the size of the encoder (or encoding circuit) that just includes a plurality of NMOS transistors, a PMOS transistor, and an inverter. And, it is convenient to expand a circuit volume by a single unit of NMOS or PMOS transistor even when the number of the external signals increases. Moreover, while the conventional scheme has the problem of being late a time delay in a redundancy operation because there is a time delay about 3 at least from an apply of the external signal to an output of the encoding signal due to passing multiple logic states, the present invention overcomes such a limit. Further there are undesirable glitches at a subsequent I/O decoder due to the time delay of signal propagation in the conventional art, the encoder according to the present invention can eliminate the glitches of the I/O decoder because it is possible to the encoding signal, i.e., the global redundancy signal, without such a time delay.

In summary, the present invention can reduce a size of an encoding circuit (or encoder) by connecting a multiplicity of external signals to a single common precharge node to output a predetermined encoding signal.

Furthermore, the present invention prevents a time delay from the apply of the external signal to the generation of the encoding signal.

As a result, the present invention rnhances the performance of a chip because it is possible to prevent the time delay in generating the global redundancy signal of the redundancy circuit and the inducement of the glitch signals thereby.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An encoding circuit of a semiconductor apparatus, comprising:
   a precharge node;
   a multiplicity of NMOS transistors connected between the precharge node and a ground voltage in parallel, being driven by a multiplicity of external signals; and
   a reset circuit for connecting output terminals of repair I/O selectors to a ground terminal in response to a logical state of the precharge node; and
   an output circuit for generating an encoding signal in accordance with the logical state of the precharge node.

2. The encoding circuit as set forth in claim 1, further comprising a first PMOS transistor for supplying a power supply voltage to the precharge node.

3. The encoding circuit as set forth in claim 2, wherein the output circuit includes:
   an inverter for converting a logical state of the precharge node into the encoding signal; and
   a second PMOS transistor for supplying the power supply voltage to the precharge node in accordance with the encoding signal.

4. The encoding circuit as set forth in claim 1, wherein the reset circuit includes a plurality of switching units connected to the ground terminal in common, wherein the switching units are operated in response to the logical state of the precharge node.

5. The encoding circuit as set forth in claim 1, wherein the reset circuit connects the output terminals of the repair I/O selectors to the ground terminal, when a redundancy operation is not performed.

6. An encoding circuit of a semiconductor apparatus, comprising:
   a precharge node;
   a first NMOS transistor for supplying a ground voltage to the precharge node;
   a multiplicity of PMOS transistors connected between the precharge node and a power supply voltage in parallel, being driven by a multiplicity of external signals;
   an output circuit for generating an encoding signal in accordance with a logical state of the precharge node, and for generating a signal by inverting the logical state of the precharge node; and
   a reset circuit for connecting output terminals of repair I/O selectors to a ground terminal in response to the signal outputted from the output circuit.

7. The encoding circuit as set forth in claim 6, wherein the output circuit includes:
   a first inverter for converting a logical state of the precharge node into a control signal;
   a second inverter for converting the control signal into the encoding signal; and
   a PMOS transistor for supplying the power supply voltage to the precharge node in accordance with the control signal.

8. The encoding circuit as set forth in claim 6, wherein the reset circuit includes a plurality of switching units connected to the ground terminal in common, wherein the switching units are operated in response to the signal generated by inverting the logical state of the precharge node.

9. The encoding circuit as set forth in claim 6, wherein the reset circuit connects the output terminals of the repair I/O selectors to the ground terminal, when a redundancy operation is not performed.

10. A redundancy control circuit of a semiconductor apparatus, comprising:
    a multiplicity of repair address selector for generating local redundancy signals in accordance with an address signal and a redundancy enable signal;
    a multiplicity of repair I/O selectors for outputting I/O information signals to be repaired in accordance with the local redundancy signals, corresponding each to the repair address sectors;
    an I/O decoder for generating I/O signals from the I/O information signals; and
    an encoder for generating reset signals to initiate the I/O information signals and for generating a global redundancy signal to inform an activation of a redundancy operation in a chip and to control the I/O decoder, in accordance with the local redundancy signals.

11. The redundancy control circuit as set forth in claim 10, wherein the encoder includes:
    a precharge node;
    a PMOS transistor for supplying a power supply voltage to the precharge node;
    a multiplicity of NMOS transistors connected between the precharge node and a ground voltage in parallel, being driven by the local redundancy signals;
    a reset circuit for generating reset signals in accordance with a logical state of the precharge node; and
    an output circuit for generating the global redundancy signal in accordance with a logical state of the precharge node.

12. The redundancy control circuit as set forth in claim 10, wherein the encoder includes:
    a precharge node;
    a first NMOS transistor for supplying a ground voltage to the precharge node;
    a multiplicity of PMOS transistors connected between the precharge node and a power supply voltage in parallel, being driven by the local redundancy signals;
    an output circuit for generating a predetermined control signal and the global redundancy signal in accordance with a logical state of the precharge node; and
    a reset circuit for generating the reset signals in accordance with the control signal.

* * * * *